United States Patent
Majdak (10) Patent No.: US 12,494,752 B2
(45) Date of Patent: Dec. 9, 2025

(54) HIGH-SPEED, HIGH-POWER OPERATIONAL AMPLIFIER AND LINEAR AMPLITUDE MODULATOR

(71) Applicant: Eridan Communications d.o.o., Zagreb (HR)

(72) Inventor: Tomislav Majdak, Zagreb (HR)

(73) Assignee: Eridan Communications d.o.o., Zagreb (HR)

( * ) Notice: Subject to any disclaimer, the term of this patent is extended or adjusted under 35 U.S.C. 154(b) by 434 days.

(21) Appl. No.: 18/342,993

(22) Filed: Jun. 28, 2023

(65) Prior Publication Data

US 2025/0007471 A1    Jan. 2, 2025

(51) Int. Cl.
*H03F 3/45*    (2006.01)
*H03F 1/02*    (2006.01)
*H03F 1/30*    (2006.01)
*H03F 1/32*    (2006.01)
*H03F 3/213*    (2006.01)

(52) U.S. Cl.
CPC ........... *H03F 3/213* (2013.01); *H03F 1/0255* (2013.01); *H03F 1/307* (2013.01); *H03F 1/3205* (2013.01); *H03F 2200/451* (2013.01)

(58) Field of Classification Search
CPC ........................................................ H03F 3/45
USPC ................................................. 330/257, 261
See application file for complete search history.

(56) References Cited

U.S. PATENT DOCUMENTS

| | | |
|---|---|---|
| 5,699,015 A | 12/1997 | Dotson et al. |
| 9,276,529 B1 | 3/2016 | Brown et al. |
| 2009/0002075 A1 | 1/2009 | Chilakapati et al. |
| 2012/0001689 A1 | 1/2012 | Ludwig |
| 2015/0028953 A1 | 1/2015 | Kovac |
| 2016/0036399 A1 | 2/2016 | McCune, Jr. |
| 2017/0019069 A1 | 1/2017 | Dunsmore |
| 2019/0339730 A1 | 11/2019 | Coln et al. |

OTHER PUBLICATIONS

International Search Report and Written Opinion, PCT Appl. No. PCT/US2024/022467.

*Primary Examiner* — Henry Choe
(74) *Attorney, Agent, or Firm* — Patent Law Professionals, P.C.; William E. Winters (57) ABSTRACT

A high-speed, high-power gallium-nitride-based (GaN-based) operational amplifier ("opamp") and a GaN-based high-power, wideband linear amplitude modulator (LAM) that may be used to implement a dynamic power supply (DPS) in a high-power, wideband polar modulator are disclosed. The high-speed, high-power GaN-based opamp comprises an input differential amplifier having an input-DC-offset-minimizing circuit and a class AB push-pull output stage including an efficiency-enhancing source follower control circuit that provides for a unique and modified form of buffered frequency compensation. The GaN-based high-power, wideband LAM comprises an input differential amplifier having an input-DC-offset-minimizing circuit, similar to that used in the GaN-based opamp, and a current boost circuit that maintains a source follower in an output stage of the LAM in saturation during times the LAM's output voltage is low.

20 Claims, 8 Drawing Sheets

HIGH-SPEED, HIGH-POWER OPERATIONAL AMPLIFIER AND LINEAR AMPLITUDE MODULATOR

BACKGROUND OF THE INVENTION

Many modern digital communications systems use a multicarrier transmission scheme known as orthogonal frequency-division multiplexing (OFDM). Rather than transmitting a high-bit-rate data stream on a single carrier over a wide bandwidth, in an OFDM transmitter multiple, lower-bit-rate data streams are modulated onto a plurality of closely-spaced, narrowband, orthogonal carriers (usually referred to as "subcarriers" or "tones") and transmitted in parallel over the same bandwidth. Because the subcarriers are orthogonal, the subcarrier frequencies can be selected such that the frequency spectra of the subcarriers overlap to some extent, without concern for inter-carrier interference, thus increasing spectral efficiency compared to more traditional frequency-division multiplexing schemes that do not utilize orthogonal subcarriers. Spectral efficiency is further enhanced in OFDM systems by employing non-constant envelope modulation formats to modulate the subcarriers. For example, in fourth-generation (4G) cellular networks, OFDM subcarriers in the downlink (base station to mobile) are modulated using either 16-QAM or 64-QAM, and in 5G networks subcarriers are modulated using 16-QAM, 64-QAM or 256-QAM, depending on the quality of the link.

Although OFDM systems are spectrally efficient and offer other important advantages such as better resilience to frequency-selective fading, they also have one very significant drawback. Specifically, the time-domain waveform produced at the output of the OFDM system's transmitter tends to have a high peak-to-average power ratio (PAPR). The high PAPR increases as the number of subcarriers increases and in linear-PA-based transmitters necessitates backing off the output RF power of the OFDM transmitter's power amplifier (PA) from its peak saturated power in order to avoid clipping the signal peaks of the PA RF output.

Figure 1:
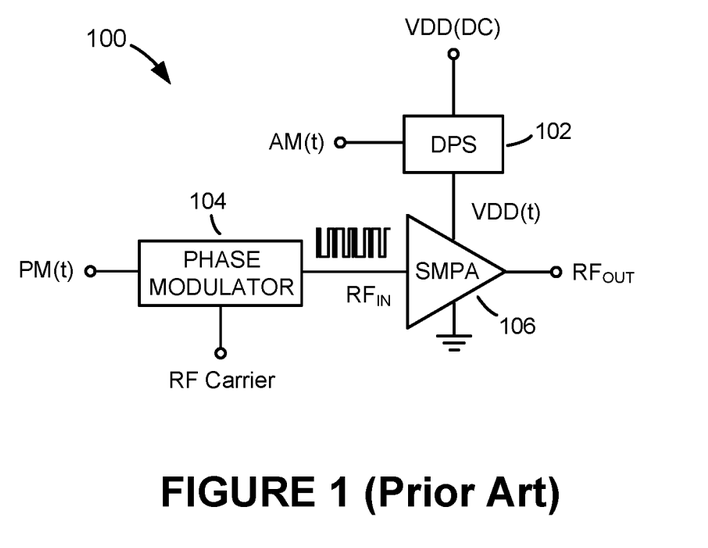
FIG. 1 is a block diagram of a conventional polar modulator.

Backing off the output RF power does help to avoid distortion (i.e., does help preserve linearity from the PA input to the PA output). However, it also substantially compromises the energy efficiency of the PA, especially when the PAPR is high, which is often the case in OFDM systems. One way to avoid this problem is to employ what is known as a "polar modulator." As illustrated in FIG. 1, a polar modulator 100 comprises a dynamic power supply (DPS) 102, a phase modulator 104, and a nonlinear switch-mode PA (SMPA) 106 (e.g., a Class D, E or F SMPA). The DPS 102 modulates a direct current (DC) power supply voltage VDD(DC) by an input amplitude-modulating signal AM(t) representing the signal envelope of the RF signal that is ultimately produced at the output of the SMPA 106, while the phase modulator 104 modulates a high-frequency RF carrier by a phase-modulating signal PM(t). As the SMPA 106 translates the resulting constant-envelope, phase-modulated RF carrier $RF_{IN}$ to higher RF power it also modulates the RF output $RF_{OUT}$ of the SMPA 106 by the DPS voltage VDD(t) produced by the DPS 102. Accordingly, the SMPA 106 not only serves as a PA that translates the phase-modulated RF carrier $RF_{IN}$ to higher power, it also serves effectively as a mixer that mixes the high-frequency phase-modulated RF carrier $RF_{IN}$ with the lower-frequency amplitude modulating signal AM(t).

Introducing the AM contained in the DPS output voltage VDD(t) through the drain supply port of the SMPA 106 is known in the power amplifier arts as "drain modulation." It is a technique that is unique to SMPAs, in other words, it does not work in linear PAs, and is exploited by the polar modulator 100 in particular to avoid having to apply the AM through the RF input port of the SMPA 106. Since the phase-modulated RF carrier $RF_{IN}$ applied to the RF input port has a constant envelope (i.e., no AM) and the SMPA 106 always operates in compression, the high-PAPR problem and attendant need to back off the output RF power is therefore obviated.

Although the polar modulator 100 is effective at avoiding the high-PAPR problem and need to back off the output RF power, and offers a much higher energy efficiency compared to linear PAs, a number of difficult challenges are encountered in its design. One of the most difficult challenges involves the design of the polar modulator's DPS 102. In some applications the SMPA 106 must be capable of producing very high output RF powers, for example tens of watts or higher, while at the same time operating over a wide bandwidth. In order for the SMPA to produce such high output RF powers, the DPS 102 must therefore be capable of supplying very high currents and generating and withstanding very high voltages.

Figure 2:
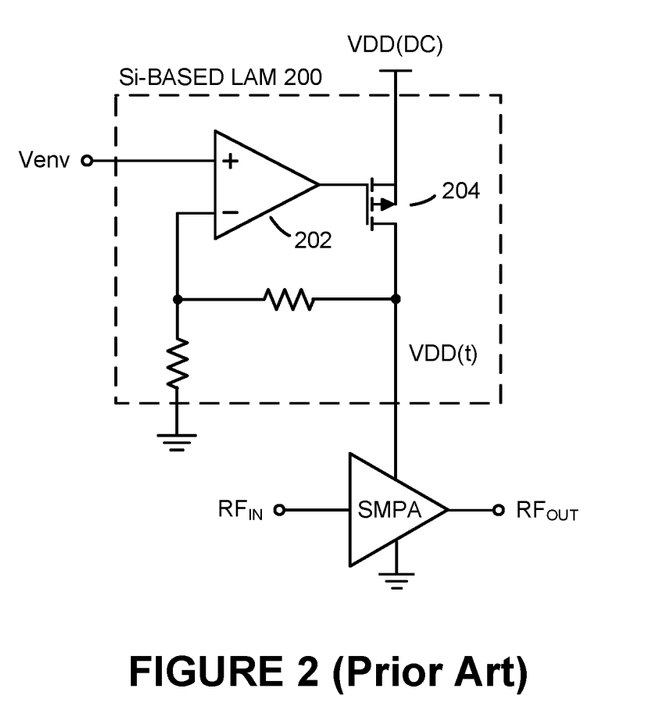
FIG. 2 is a block diagram of a prior art silicon-based (Si-based) linear amplitude modulator (LAM)

In low-power, narrowband applications, a silicon-based (Si-based) linear amplitude modulator (LAM) can be used to implement the DPS 102. As illustrated in FIG. 2, the Si-based LAM 200 comprises a silicon operational amplifier (i.e., "opamp") 202 and a silicon p-channel metal-oxide-semiconductor field-effect transistor (i.e., silicon "p-channel MOSFET" or silicon "PMOS") pass element 204. The silicon opamp 202 serves as an error amplifier that continuously samples and compares the DPS supply voltage VDD(t) to an envelope signal Venv representing the amplitude-modulating signal AM(t). As the amplitude of the envelope Venv signal changes over time, the silicon opamp 202 adjusts the amplitude of the DPS supply voltage VDD(t) accordingly, via the PMOS pass element 204. Unfortunately, silicon MOSFETs have low breakdown voltages, which render them and the Si-based LAM 200 incapable of withstanding the high voltages that are present in high power applications. Moreover, particularly in wideband applications, the Si-based LAM 200 lacks the bandwidth necessary to accurately reproduce the AM contained in the input amplitude-modulating signal AM(t) in the DPS supply voltage VDD(t).

The unsuitability of silicon MOSFETs and the Si-based LAM 200 for high-power, wideband DPS applications is due in large part to the material and electronic properties of Si itself. This problem can be overcome, at least in theory, by using a different semiconductor to construct the opamp and LAM. One of the most promising candidates is the III-nitride semiconductor gallium nitride (GaN). GaN has a larger energy bandgap than Si (3.4 eV versus 1.1 eV @ 300K) and an order-of-magnitude higher breakdown field (3.3 MV/cm versus 0.3 MV/cm). Exploiting these properties, semiconductor physicists have demonstrated the feasibility of manufacturing GaN transistors, in particular GaN high-electron-mobility transistors (or "GaN-HEMTs"), having very high breakdown voltages (>100V).

GaN also has excellent electrical transport properties. Specifically, although GaN in its bulk form has a modest electron mobility $\mu_e$ comparable to that observed in bulk Si (~1,400 cm$^2$/Vs @ 300K), the electron mobility $\mu_e$ is substantially increased (to >2,000 cm$^2$/Vs) when the electrons are confined to a two-dimensional electron gas (2DEG), such as in the 2DEG of the GaN-HEMT. Electrons in the GaN-HEMT also have a high saturation velocity $v_{sat}$(~2× 10$^7$ cm/s). The high electron mobility $\mu_e$ and high saturation velocity $v_{sat}$ thus allow GaN-HEMTs to be manufactured having transition frequencies $f_T$ in excess of 100 GHz.

Together, the high-breakdown-voltage capability and superior electronic transport properties of the GaN-HEMT appear to make it an ideal candidate for building a GaN-based LAM that can properly serve as the DPS in a high-power, wideband polar modulator. However, designing a GaN-based LAM is complicated by the fact that GaN-HEMTs are depletion mode devices. Depletion mode devices (sometimes referred to as "normally on" devices) have a negative threshold voltage, meaning that in the absence of any applied voltage a conductive channel is formed and present between their drain and source and, consequently, a negative voltage must be applied to their gate in order to deplete the channel and turn them off. Because of this problem and for other reasons, designing a GaN-based opamp and LAM presents substantially different design challenges than are encountered in the design of Si opamps and Si-based LAMs, which are manufactured from enhancement mode devices. These design challenges are further complicated by the fact that GaN-HEMTs are only available as n-channel devices. This is unlike in the design of Si opamps and Si-based LAMs, where both n-channel and p-channel devices (i.e., complementary NMOS and PMOS transistors) are available to facilitate the design.

BRIEF SUMMARY OF THE INVENTION

A high-speed, high-power operational amplifier ("opamp") and a high-power, wideband linear amplitude modulator (LAM) that may be used to implement a dynamic power supply (DPS) in a high-power, wideband polar modulator are disclosed. The high-speed, high-power opamp and high-power, wideband LAM are both constructed entirely from n-channel, depletion mode field-effect transistors-preferably n-channel GaN high-electron-mobility transistors (GaN-HEMTs).

An exemplary embodiment of the high-speed, high-power opamp comprises a GaN-based input differential amplifier having an input-DC-offset-minimizing circuit and a GaN-based class AB push-pull output stage including an efficiency-enhancing source follower control circuit that provides for a unique and modified form of buffered frequency compensation.

An exemplary embodiment of the high-power, wideband LAM comprises a GaN-based input differential amplifier having an input-DC-offset-minimizing circuit, similar to that used in the GaN-based high-speed, high-power opamp, and a current boost circuit that maintains a source follower in an output stage of the high-power, wideband LAM in saturation during times the LAM's output voltage is low.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 3:
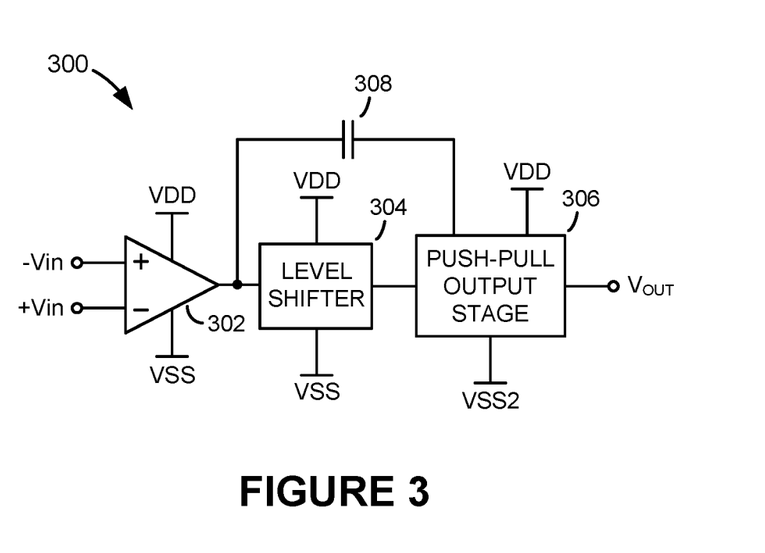
FIG. 3 is a block diagram of a gallium-nitride-based (GaN-based) operational amplifier (opamp), according to one embodiment of the present invention.

Referring to FIG. 3, there is shown a block diagram of an operational amplifier (opamp) 300, according to one embodiment of the present invention. The opamp 300 comprises a differential amplifier 302, an interstage level shifter 304, a push-pull class AB output stage 306, and a frequency-compensation capacitor 308. In general, the differential amplifier 302 operates to amplify an input differential voltage −Vin/+Vin; the interstage level shifter 304 shifts the DC level of the differential amplifier's single-ended output to a level appropriate for biasing the input of the push-pull class AB output stage 306; and the push-pull class AB output stage amplifies the level-shifted signal to a voltage suitable for driving an attached load (not shown in FIG. 3). The frequency-compensation capacitor 308 is connected between the push-pull class AB output stage 306 and the input of the interstage level shifter 304, and, as will be explained in more detail below, operates in cooperation with a source follower in a control circuit portion of the class AB output stage 306 to provide a modified form of buffered frequency compensation.

Figure 4:
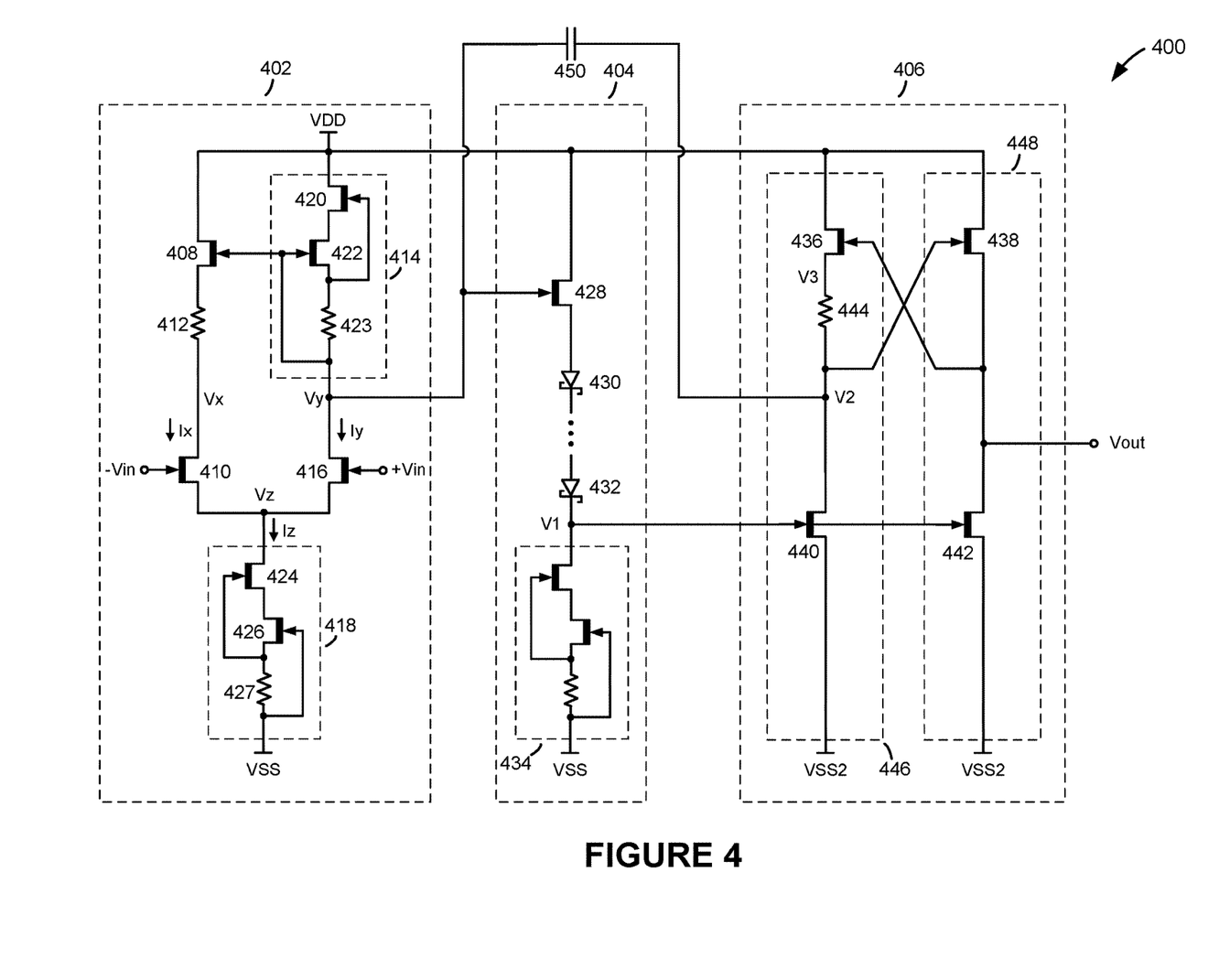
FIG. 4 is a schematic diagram of a GaN-based opamp, according to one embodiment of the present invention.

FIG. 4 is a schematic diagram of an opamp 400 having a design that follows the model opamp 300 depicted in FIG. 3, according to one embodiment of the present invention. As in FIG. 3, the opamp 400 depicted in FIG. 4 comprises three stages: an input differential amplifier 402, an interstage level shifter 404, and class AB push-pull output stage 406. Preferably, all three stages are implemented in a single GaN-based integrated circuit (IC) with all of the various transistors fabricated as n-channel, depletion mode GaN-HEMTs. Because the GaN-HEMT is a field-effect transistor (FET) that operates similar to a conventional metal-semiconductor field-effect transistor (MESFET), the GaN-HEMTs in FIG. 4, as well as the GaN-HEMTs in other schematic diagrams of this disclosure involving the present invention, are depicted using the conventional n-channel, depletion mode transistor symbol commonly used for an n-channel, depletion mode MESFET.

As illustrated in FIG. 4, the input differential amplifier 402 comprises a first arm including GaN-HEMTs 408 and 410 and resistor 412; a second arm including a first current source 414 and GaN-HEMT 416; and a second (i.e. "tail")

current source 418. Both the first and second current sources 414 and 418 comprise two cascaded GaN-HEMTs (GaN-HEMTs 420 and 422 in the first current source, and GaN-HEMTs 424 and 426 in the second current source). Current Iy through the first current source 414 is regulated by GaN-HEMT 422 and VDS(422)=−VGS(420), and the DC value of the current Iy is determined by the resistance of current-regulating resistor 423. Similarly, the current Iz=2Iy flowing through the second current source 418 is regulated by GaN-HEMT 426 and VDS(426)=−VGS(424), and the DC value of the current Iz is determined by the resistance of current-regulating resistor 427. The first and second current sources 414 and 418 are preferred over more conventional single-FET current sources since they provide a significantly higher output resistance and are less susceptible to process-voltage-temperature (PVT) variations, which is particularly important for the first current source 414 in the second arm of the differential amplifier 402 since PVT variations can have a deleterious effect on the differential amplifier's input DC offset voltage.

Figure 5:
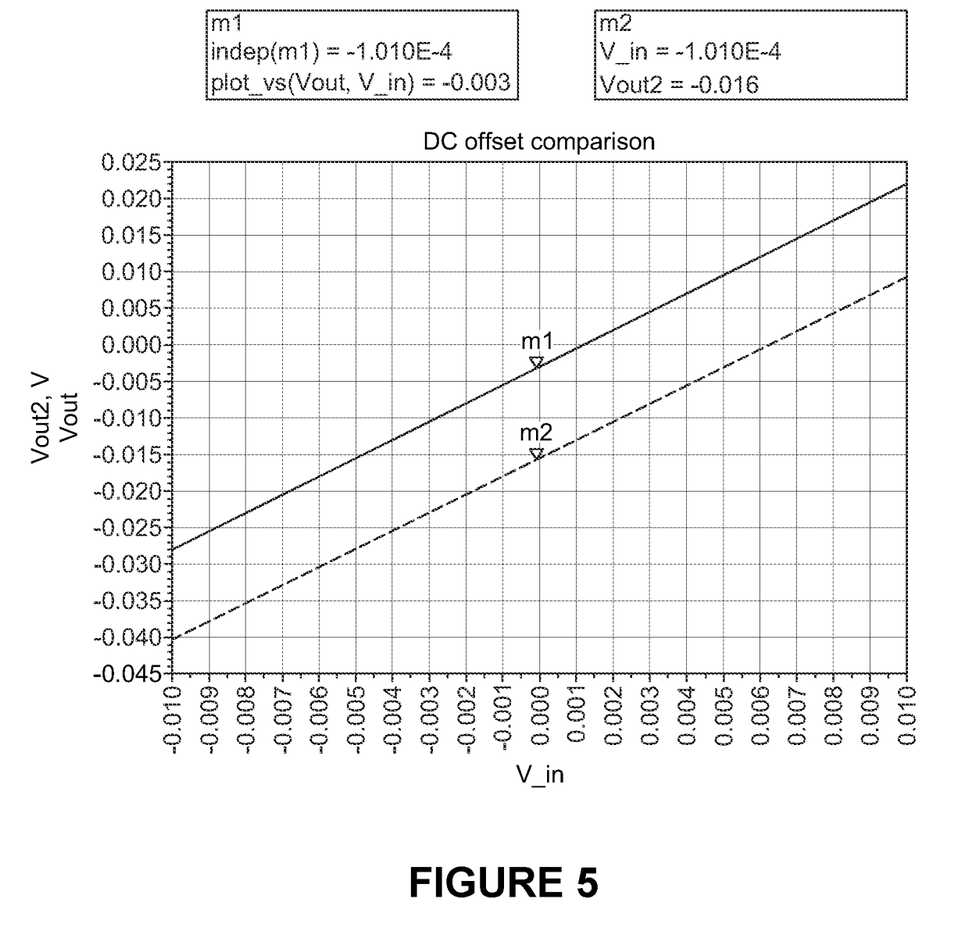
FIG. 5 is a graph that compares the input-output voltage DC transfer functions of the GaN-based opamp depicted in FIG. 4 with (solid line) and without (dashed line) an input-DC-offset-minimizing resistor included in the left arm of the GaN-based opamp's input differential amplifier.

The GaN-HEMT 408 and resistor 412 in the first arm of the opamp 400 operate as a source follower, buffering the signal from node Vy in the second arm to node Vx in the first arm via positive feedback. To ensure that the voltages at nodes Vx and Vy are kept the same, GaN-HEMT 408 in the first arm and GaN-HEMT 422 in the second arm are fabricated identically with substantially the same gate width-to-length (W/L) ratio, and resistor 412 in the first arm and the current-regulating resistor 423 of the first current source 414 in the second arm are fabricated to have substantially the same resistance. Maintaining nodes Vx and Vy at the same DC potential thus ensures that the drain-source voltage drops across the input GaN-HEMTs 410 and 416 are kept substantially the same, thereby minimizing DC offset at the final output Vout of the opamp 400. It should be pointed out that the presence of resistor 412 (which may be referred to as the "input-DC-offset-minimizing resistor 412") is particularly important in minimizing the opamp's input offset voltage. As can be seen in FIG. 5, which is a graph comparing the input-output voltage DC transfer functions of the opamp 400 with (solid line) and without (dashed line) input-DC-offset-minimizing resistor 412 present, the DC offset is substantially reduced from 16 mV to 3 mV when the input-DC-offset-minimizing resistor 412 is present.

The interstage level shifter 404 comprises GaN-HEMT 428, GaN Schottky diodes 430 and 432, and current source 434. The interstage level shifter 404 serves to shift the DC level produced at output node Vy of the differential amplifier 402 to a more negative value at node V1 most appropriate for biasing GaN-HEMTs 440 and 442 in the class AB push-pull output stage 406. The shift to a more negative DC voltage is carried out by way of forward voltage drops across GaN Schottky diodes 430 and 432. Taking into consideration that the negative supply voltage VSS is more negative than the negative supply voltage VSS2 (necessary to maintain a high output resistance in the current source 434), the number of GaN Schottky diodes used in the design (only two are shown in the drawing) is selected so that the DC bias resulting at node V1 is more positive than the negative supply voltage VSS2 by at least the saturation voltage of GaN-HEMTs 440 and 442.

The push-pull class AB output stage 406 comprises GaN-HEMTs 440 and 442, GaN-HEMTs 436 and 438, and a resistor 444. Functionally, the push-pull class AB output stage 406 can be separated into two subcircuits: a control circuit 446 (comprising GaN-HEMTs 436 and 440 and resistor 444) and an output circuit 448 (comprising GaN-HEMTs 438 and 442). The control circuit 446 controls current through the output circuit 448 by operating GaN-HEMTs 438 and 442 with equal gate bias just above cutoff for class AB operation. (In another embodiment of the invention, where a slightly higher cross-over distortion is tolerable, GaN-HEMTs 438 and 442 are biased for class B operation.) As the voltage at node V1 moves toward a more positive value, the current through GaN-HEMT 440 increases, causing the voltage drop across the resistor 444 in the control circuit 446 to also increase and the voltage at node V2 to be pulled to a more negative value. As the voltage at node V1 and voltage drop across resistor 444 continue increasing and the voltage at node V2 continues to fall, GaN-HEMT 438 eventually stops conducting. This condition occurs when the voltage difference between V2 and Vout becomes more negative than the threshold voltage Vth of the GaN-HEMTs (assumed to be the same for all GaN-HEMTs), in other words, when Vth>(V2−Vout). During this time when the voltage at node V1 is increasing to a more positive value and the voltage at node V2 is decreasing to a more negative value, the output voltage Vout also decreases since GaN-HEMT 438 operates as a source follower.

Conversely, as the voltage at node V1 moves toward a more negative voltage, the current through GaN-HEMTs 440 and 442 decreases, causing the voltage drop across the resistor 444 in the control circuit 446 to also decrease and the voltage at node V2 to be pulled up to a more positive value. As the voltage at node V1 and voltage drop across resistor 444 continue to fall and the voltage at node V2 continues to rise, GaN-HEMT 442 eventually stops conducting. This condition occurs when the voltage difference between V1 and VSS2 becomes more negative than the threshold voltage Vth, in other words, when Vth>(V1−VSS2). During this time when the voltage at node V1 is decreasing and the voltage at node V2 is increasing, the output voltage Vout also increases, again, because GaN-HEMT 438 operates as a source follower.

It should be mentioned that for push-pull operation and in the interest of maximizing efficiency, GaN-HEMT 442 should be off while GaN-HEMT 448 is conducting and, conversely, GaN-HEMT 448 should be off while GaN-HEMT 442 is conducting. Including resistor 444 (which may be referred to as "efficiency-enhancing resistor 444") helps satisfy this condition. Specifically, as the voltage applied to the gates of GaN-HEMTs 440 and 442 increases, the current flowing through GaN-HEMT 440 increases, resulting in an increased voltage drop across resistor 444 and consequently a lowering of the voltage at node V2 (gate of GaN-HEMT 438). The lower voltage at node V2 helps facilitate the turning off of GaN-HEMT 438 during times GaN-HEMT 442 is conducting, and consequently makes the push-pull class AB output stage 406 more energy efficient compared to if the efficiency-enhancing resistor 444 was not present.

Figure 6A:
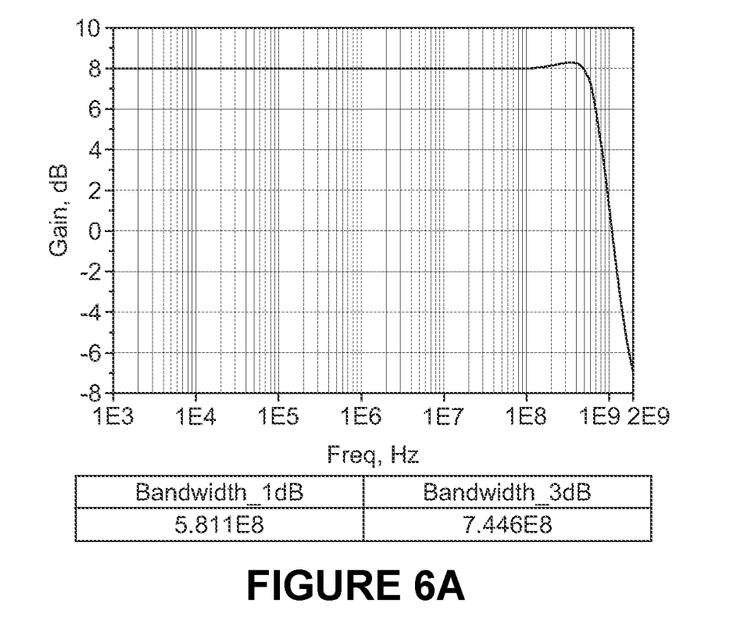
FIG. 6A is a Bode plot of the GaN-based opamp depicted in FIG. 4, highlighting how the GaN-based opamp's bandwidth is enhanced by utilizing, in accordance with one embodiment of the present invention, a modified form of buffered frequency compensation.
Figure 6B:
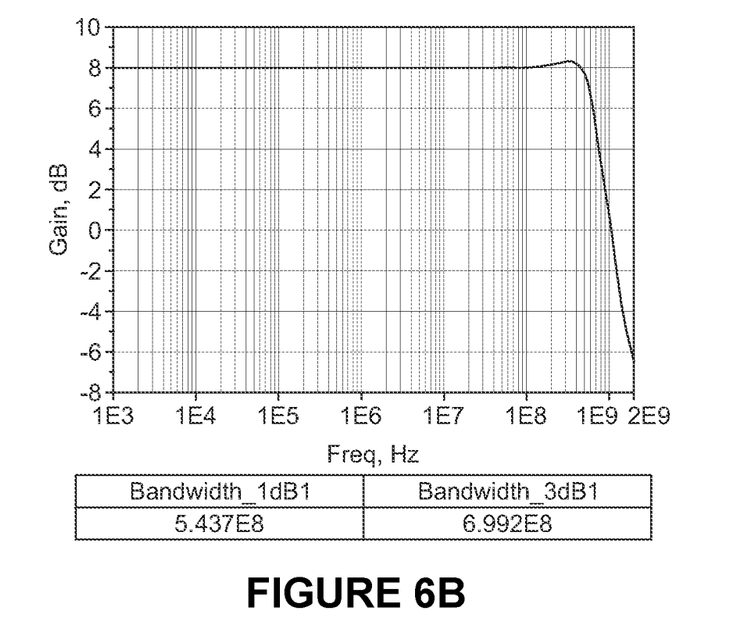
FIG. 6B is a Bode plot of the GaN-based opamp depicted in FIG. 4 but modified to utilize standard Miller frequency compensation instead of the modified form of buffered frequency compensation of the present invention.

In addition to providing energy efficient class AB operation, the opamp 400 also beneficially provides a modified form of buffered frequency compensation. Specifically, by virtue of its configuration as a source follower in the control circuit 446, the GaN-HEMT 436 naturally lends itself as an active element that eliminates (i.e., blocks) the feedforward path through the frequency-compensation capacitor 450. Eliminating the feedforward path effectively removes the undesirable right half-plane zero (RHPZ) from the root locus (i.e., complex s-plane) of the opamp's closed-loop transfer function, thereby enhancing both the stability and closed-loop bandwidth of the opamp 400. The enhanced bandwidth, in particular, can be observed by comparing the Bode plot in FIG. 6A (opamp 400 utilizing the modified form of buffered frequency compensation of the present invention) to the Bode plot of the opamp when reconfigured to utilize standard Miller frequency compensation, instead (FIG. 6B). Comparing the two different frequency responses reveals that by exploiting the modified form of buffered frequency compensation of the present invention the opamp 400 is able to achieve roughly 50 MHz higher −1 dB and −3 dB bandwidths. The Bode plot in FIG. 6A also reveals that the opamp 400 has a gain-bandwidth product (GBW) greater than 1 GHz, an important attribute that is not achievable in Si-based opamps.

Figure 7:
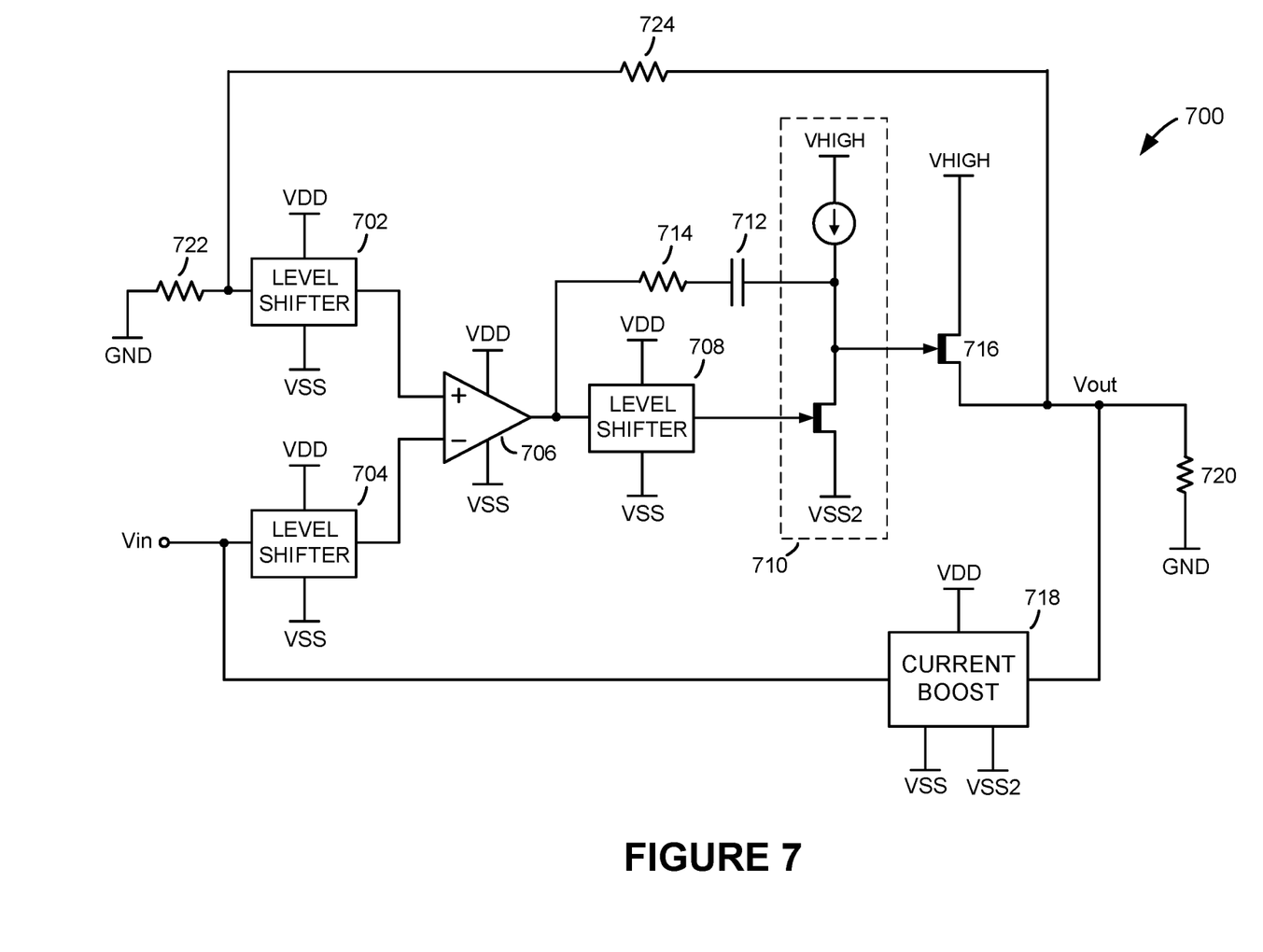
FIG. 7 is a block diagram of a GaN-based LAM, according to an embodiment of the present invention.

Referring next to FIG. 7, there is shown a block diagram of a linear amplitude modulator (LAM) 700, according to an embodiment of the present invention. The LAM 700 comprises first and second input level shifters 702 and 704; a differential amplifier 706; an interstage level shifter 708; a second (common source) gain stage 710; a frequency compensation network including frequency-compensation capacitor 712 and frequency-compensation resistor 714; a source follower (common drain) output stage 716; a current boost circuit 718; and first and second voltage-gain-setting resistors 722 and 724. The first and second input level shifters 702 and 704 serve to shift the DC level of the input voltage Vin, which may be, for example, an amplitude varying signal representing the AM in a polar modulator, to a more negative value, so that the quiescent point of the differential amplifier 706 is then more negative than it would otherwise be and so that the differential amplifier 706 can be supplied from a lower supply voltage, thereby minimizing power dissipation. In one embodiment of the invention, the differential amplifier 706 has the same topology as the differential amplifier 402 of the opamp 400 described above, including the circuitry that helps minimize the input DC offset voltage. The interstage level shifter 708 shifts the DC level of the differential amplifier's single-ended output to a DC level appropriate for biasing the second gain stage 710. The output of the second gain stage 710 is DC coupled to the source follower output stage 716 and in this exemplary embodiment of the LAM 700 both the second gain stage 710 and source follower output stage 716 share the same power supply voltage VHIGH, although in other embodiments of the LAM the second gain stage 710 and source follower output stage 716 are powered by different power supplies. Preferably, the output stage transistor (preferably a large GaN-HEMT with a high breakdown voltage) is capable of delivering a very high current to a load 720, which may comprise an internal load (i.e., internal to the GaN IC) or an external load, for example, a switch-mode power supply (SMPA) in a polar modulator or a linear PA in an envelope-tracking (ET) transmitter. Finally, the current boost circuit 718 serves to keep the GaN-HEMT of the output stage 716 in saturation (i.e., prevents it from entering its triode region of operation), even at low output voltages Vout and even for light loads.

Figure 8:
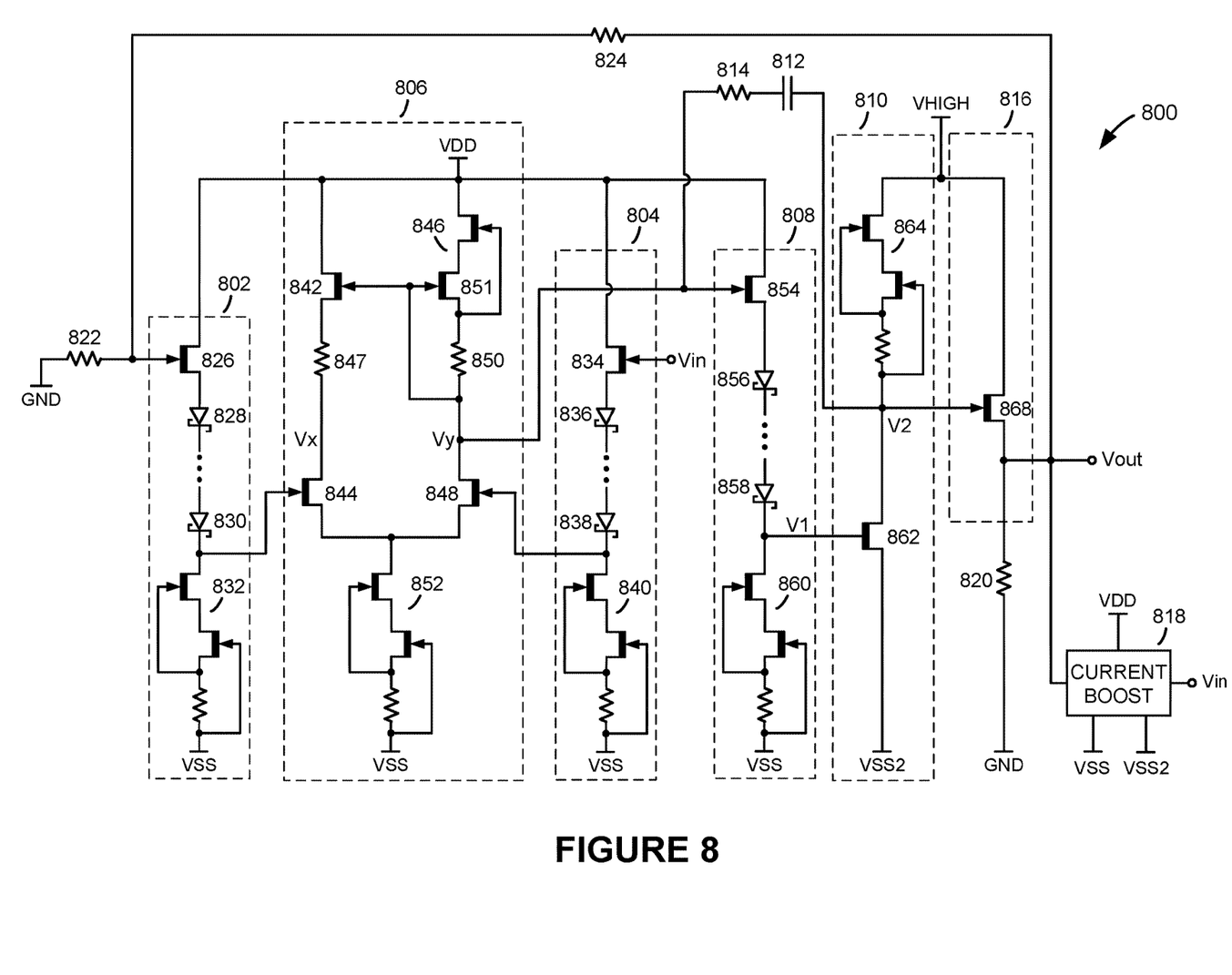
FIG. 8 is a schematic diagram of a GaN-based LAM, according to an embodiment of the present invention.

FIG. 8 is a schematic diagram of a LAM 800 having a design that follows the model LAM 700 depicted in FIG. 7, according to one embodiment of the present invention. Similar to the model LAM 700, the LAM 800 includes first and second level shifters 802 and 804, a differential amplifier 806, an interstage level shifter 808, a common-source gain stage 810, a frequency compensation network comprising frequency-compensation capacitor 812 and frequency-compensation resistor 814, a source follower output stage 816, a current boost circuit 818, and first and second voltage-gain-setting resistors 822 and 824. Preferably, though not necessarily, the LAM 800 is fabricated in a single GaN-based IC with all of the various transistors being n-channel, depletion mode GaN-HEMTs. The LAM 800 operates as a noninverting amplifier. Accordingly, the closed-loop voltage gain of the LAM 800 is Av=1+R(824)/R(822).

As further illustrated in FIG. 8, the first level shifter 802 comprises a first input GaN-HEMT 826 with its input (gate) coupled to ground via the first voltage-gain-setting resistor 822; GaN Schottky diodes 828 and 830; and cascade current source 832. The second level shifter 804 comprises a second input GaN-HEMT 834 with its gate configured to receive an input voltage Vin; GaN Schottky diodes 836 and 838; and cascade current source 840. Cascade current source 832 in the first level shifter 802 provides biasing and a constant load to GaN-HEMT 826. Similarly, cascade current source 840 in the second level shifter 804 provides biasing and a constant load to GaN-HEMT 834. Depending on the input common mode range, additional GaN Schottky diodes can be inserted between GaN Schottky diodes 828 and 830 in the first level shifter 802 and between GaN Schottky diodes 836 and 838 in the second level shifter 804, as indicated by the ellipses in the drawing.

The outputs of the first and second level shifters 802 and 804 are DC coupled to the differential input of the differential amplifier 806. The differential amplifier 806 comprises a first arm including GaN-HEMTs 842 and 844, and resistor 847; a second arm including first cascade current source 846, GaN-HEMT 848, and resistor 850; and a second (tail) cascade current source 852. The differential amplifier 806 operates in substantially the same manner as the differential amplifier 402 in the opamp 400 describe above. Specifically, GaN-HEMT 842 and resistor 847 operate as a source follower, buffering the voltage from node Vy in the second arm to node Vx in the first arm via positive feedback. To ensure that the voltages at nodes Vx and Vy are kept the same, GaN-HEMT 842 in the first arm and GaN-HEMT 851 in the second arm are fabricated identically with substantially the same gate W/L ratio, and the resistor 847 in the first arm and the current-regulating resistor 850 of the first cascade current source 846 in the second arm are fabricated so that they have substantially the same resistance. By forcing the voltages at nodes Vx and Vy to the same DC potential, the drain-source voltage drops across GaN-HEMTs 844 and 848 are kept substantially the same and the DC offset at the LAM output is consequently minimized.

The interstage level shifter 808 of the LAM 800 comprises GaN-HEMT 854, GaN Schottky diodes 856 and 858, and cascade current source 860. The interstage level shifter 808 shifts the DC level produced at output node Vy of the differential amplifier 806 to a more negative value at node V1, thereby ensuring proper biasing and operation of the GaN-HEMT 862 in the common-source gain stage 810. The shift to a more negative DC voltage is carried out by way of forward voltage drops across GaN Schottky diodes 856 and 858. Taking into consideration that the negative supply voltage VSS is more negative than the negative supply voltage VSS2 (necessary to maintain a high output resistance in the current source 860), the number of GaN Schottky diodes used in the design (only two are shown in the drawing) is selected so that the DC bias resulting at node V1 is more positive than the negative supply voltage VSS2 by at least the saturation voltage of the GaN-HEMT 862 in the common-source gain stage 810.

The common-source gain stage 810 is configured to receive the level-shifted output produced at output node V1 of the interstage level shifter 808, and comprises GaN- HEMT 862 and cascade current source 864. Cascade current source 864 serves as both a constant current source and as an active load for GaN-HEMT 862, and is sized to achieve a desired output slew rate, which is affected mostly by the gate-drain capacitance of the typically-large GaN-HEMT 868 in the source follower output stage 816.

GaN-HEMT 868 of the source follower output stage 816 operates as a source follower and as a power stage responsible for delivering high current to a load 820, which may comprise an internal load (i.e., internal to the GaN IC) or an external load, for example, a switch-mode power supply (SMPA) in a polar modulator or a linear PA in an envelope-tracking (ET) transmitter, where in both applications the LAM output voltage Vout serves as a dynamic power supply voltage (DPS) that tracks or follows the AM carried by the input voltage Vin. Since the GaN-HEMT 868 must typically be capable of delivering very high currents in such applications, its gate area (W×L) is made much larger than the gate areas of the other GaN-HEMTs of the LAM 800. Additionally, in such applications, the upper supply voltage VHIGH shared by the common-source gain stage 810 and source follower output stage 816 is much greater than the upper supply voltage Vdd used to power the preceding stages of the LAM 800. In general, Vdd is made large enough to support the input common mode range and VHIGH is made large enough to support the large voltage swing of Vout.

To help maintain stability and to increase the operating bandwidth, the LAM 800 is frequency compensated using the series combination of the frequency-compensation capacitor 812 and frequency-compensation resistor 814. By connecting the series combination of the frequency-compensation capacitor 812 and frequency-compensation resistor 814 between node Vy of the output of the differential amplifier 806 and the common-source gain stage 810, pole splitting is achieved.

It should be mentioned that, like the opamp 400 described above, the LAM 800 may be constructed from other types of n-channel depletion mode devices other than GaN-HEMTs, e.g., n-channel JFETs or n-channel depletion mode FETs made from other types of semiconductor materials. However, in preferred embodiments of the invention the opamp 400 and LAM 800 are both fabricated using GaN-HEMTs due to their excellent electronic transport properties and high breakdown voltages—both of which allow a DPS for a polar modulator to be constructed that is capable of supplying very high currents at very high voltages and at the same time operate over a very wide bandwidth.

The purpose of the current boost circuit 818 is to keep the GaN-HEMT 868 of the source follower output stage 816 in saturation during times the output voltage Vout is low and very little current is flowing through the load 820. Without the current boost circuit 818, the GaN-HEMT 868 will tend to enter its triode region of operation at low voltages, but with the current boost circuit 818 in place current is forced to flow through the load 820 during times the output voltage Vout approaches zero volts, thereby forcing the GaN-HEMT 868 to remain in the saturation regardless of what the magnitude of Vout happens to be.

Figure 9:
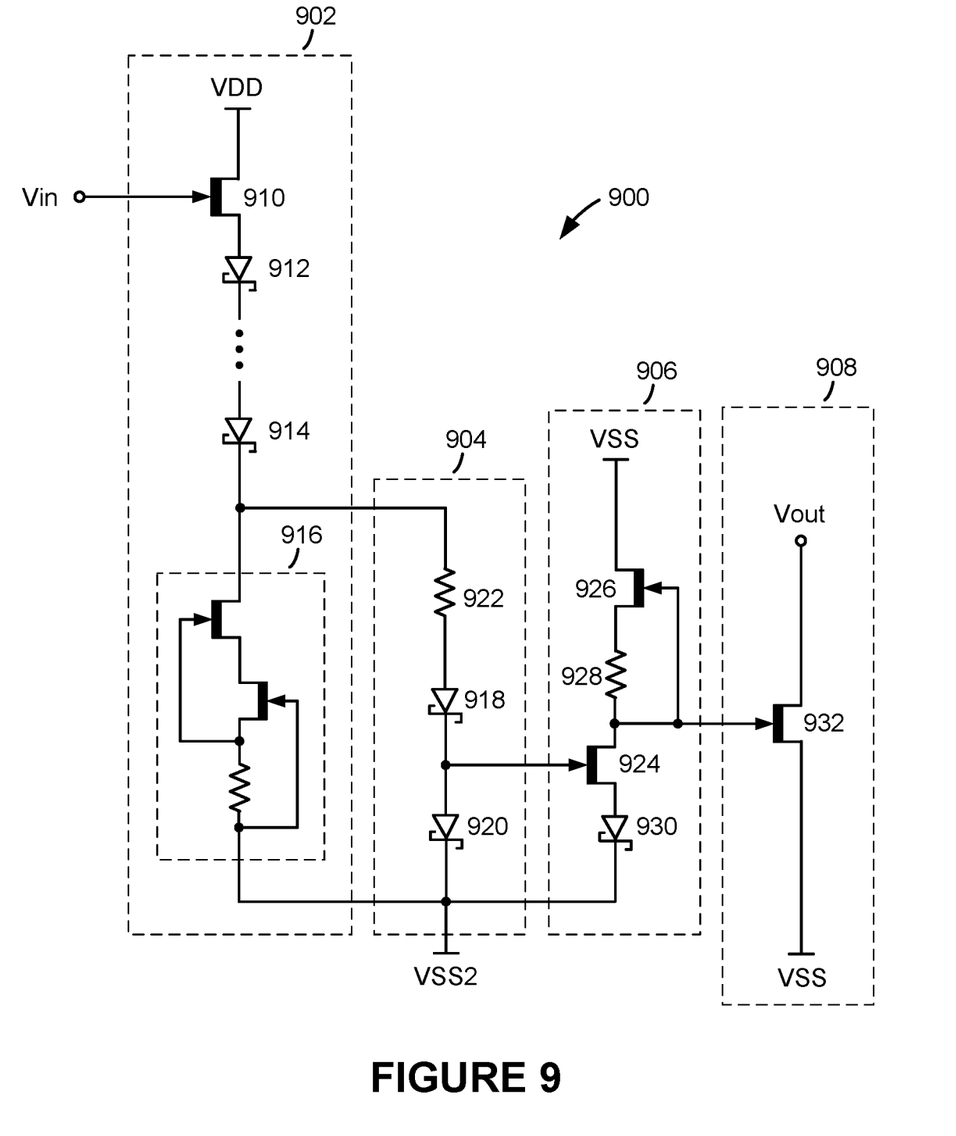
FIG. 9 is a schematic diagram of the current boost circuit of the GaN-based LAM depicted in FIG. 8, according to one embodiment of the invention.

FIG. 9 is a schematic diagram illustrating how the current boost circuit 818 is constructed in one embodiment of the invention. As shown, the current boost circuit 900 comprises an input DC level shifter 902, a diode clipper 904, a common-source amplifier 906, and a current source 908. The input DC level shifter 902 comprises an input GaN-HEMT 910, GaN Schottky diodes 912 and 914 (two or more), and a current source 916, and serves to shift the input signal Vin by a level that results in the minimum value of Vout being close to the negative supply voltage VSS. The diode clipper 904 comprises GaN Schottky diodes 918 and 920, which limit the maximum value of voltage that can be applied to the GaN-HEMT 924 of the common-source amplifier 906, thereby protecting GaN-HEMT 924, and a current-limiting resistor 922 that limits the current flowing into the GaN Schottky diodes 918 and 920. The LAM input voltage Vin is in phase with the output voltage Vout, but the current boost circuit must turn on when Vout approaches 0V and this requires inverting the input signal. To accomplish this inversion, the common-source amplifier 906 is used. The common-source amplifier 906 comprises GaN-HEMT 926 and resistor 928, which serve as an active load for GaN-HEMT 924, and GaN Schottky diode 930, which sets the bias for GaN-HEMT 924. The GaN-HEMT 932 in the current source 908 is driven by the inverted output of the common-source amplifier 906, effectively causing the GaN-HEMT 932 to operate as a voltage-controlled current source. During times that Vout approaches zero GaN-HEMT 932 turns on to sink current from the load 820 (see FIG. 8) so that the GaN-HEMT 868 of the source follower output stage 816 remains in saturation, in other words, so that the GaN-HEMT 868 does not enter its triode region of operation.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. An operational amplifier (opamp), comprising:
   an input differential amplifier having a first arm including a first depletion mode field-effect transistor (FET) coupled in series with an input DC-offset-minimizing resistor, a second arm having a first current source including second and third cascaded depletion mode FETs and a current-regulating resistor connected in series with the second and third cascaded depletion mode FETs, and a tail current source coupled to the first and second arms;
   an output amplifier; and
   an interstage level shifter configured to shift a DC level of a single-ended output of the input differential amplifier to a level-shifted DC value appropriate for biasing the output amplifier.

2. The opamp of claim 1, wherein the first and second depletion mode FETs have substantially the same gate width-to-length (W/L) ratio, and the input-DC-offset-minimizing resistor and current-regulating resistor have substantially the same resistance.

3. The opamp of claim 1, wherein the output amplifier comprises a push-pull amplifier.

4. The opamp of claim 3, wherein the push-pull amplifier comprises a push-pull class AB amplifier.

5. The opamp of claim 3, wherein the push-pull amplifier comprises a control circuit having fourth and fifth depletion mode FETs and an efficiency-enhancing resistor coupled between a source of the fourth depletion mode FET and a drain of the fifth depletion mode FET, and an output circuit having a sixth depletion mode FET with a gate coupled to the drain of the fifth depletion mode FET and a source coupled to a gate of the fourth depletion mode FET.

6. The opamp of claim 5, wherein the output circuit further comprises a seventh depletion mode FET having a drain connected to the source of the sixth depletion mode FET, and wherein the source-drain connection formed between the sixth and seventh depletion mode FETs serves as an output of the opamp.

7. The opamp of claim 6, further comprising a frequency-compensation capacitor coupled between a first node in the control circuit of the push-pull amplifier and a second node in the second arm of the input differential amplifier.

8. The opamp of claim 7, wherein the fourth depletion mode FET in the control circuit of the push-pull amplifier is configured to operate both as a source follower that follows an output voltage Vout produced at the output of the opamp and as an active element that blocks a feedforward path through the frequency-compensation capacitor.

9. The opamp of claim 1, wherein the opamp comprises a gallium nitride (GaN) integrated circuit with all of the depletion mode FETs of the opamp being n-channel depletion mode GaN high-electron-mobility transistors (GaN-HEMTs).

10. The opamp of claim 9, wherein the opamp has a gain-bandwidth product greater than 1 GHz.

11. The opamp of claim 1, wherein the opamp has a gain-bandwidth product greater than 1 GHz.

12. A linear amplitude modulator (LAM), comprising:
   an input differential amplifier;
   a first common-source amplifier configured to amplify a single-ended output voltage of the input differential amplifier;
   a source follower output stage including a first depletion mode field-effect transistor (FET) that is controlled according to a voltage produced at an output of the common-source gain stage and configured to supply current to a load; and
   a current boost circuit that maintains the first depletion mode FET in saturation during times an output voltage Vout of the source follower output stage is zero or near zero volts.

13. The LAM of claim 12, wherein the input differential amplifier comprises a first arm including a second depletion mode field-effect transistor (FET) coupled in series with an input-DC-offset-minimizing resistor, a second arm comprising a first current source including third and fourth cascaded depletion mode FETs and a current-regulating resistor connected in series with the third and fourth cascaded depletion mode FETs, and a tail current source coupled to the first and second arms.

14. The LAM of claim 13, further comprising an interstage level shifter configured to shift a DC level of the single-ended output signal of the input differential amplifier to a level-shifted DC value appropriate for biasing the first common-source amplifier.

15. The LAM of claim 14, further comprising a frequency compensation network coupled between the input of the interstage level shifter and output of the common-source amplifier.

16. The LAM of claim 12, wherein the current boost circuit comprises:
   a second common-source amplifier;
   an input DC level shifter configured to shift a DC level of a LAM input voltage Vin to a level-shifted DC value appropriate for biasing the second common-source amplifier; and
   a voltage-controlled current source including a second depletion mode FET that is controlled by the second common-source amplifier.

17. The LAM of claim 16, wherein the second common-source amplifier comprises a third depletion mode FET configured to be driven by the level-shifted LAM input voltage and an active load including a fourth depletion mode FET.

18. The LAM of claim 17, further comprising a diode clipper that limits the maximum voltage that can be applied to a gate of the third depletion mode FET in the second common-source amplifier.

19. The LAM of claim 12, wherein the load comprises a switch-mode power amplifier (SMPA) of a polar modulator or a linear PA in an envelope tracking (ET) power amplifier and the output voltage Vout of the source follower output stage serves as a dynamic power supply (DPS) voltage for the SMPA or linear PA.

20. The LAM of claim 12, wherein the LAM comprises a gallium nitride (GaN) integrated circuit with all of the depletion mode FETs of the LAM being n-channel depletion mode GaN high-electron-mobility transistors (GaN-HEMTs).

* * * * *